United States Patent [19]

Blum

[11] Patent Number: 5,302,024
[45] Date of Patent: Apr. 12, 1994

[54] MONOLITHIC MICROWAVE POWER SENSOR USING A HEAT SENSING DIODE JUNCTION

[75] Inventor: Michael W. Blum, Nashua, N.H.

[73] Assignee: Lockheed Sanders, Inc., Nashua, N.H.

[21] Appl. No.: 24,927

[22] Filed: Feb. 26, 1993

Related U.S. Application Data

[63] Continuation of Ser. No. 818,723, Jan. 6, 1992, abandoned, which is a continuation of Ser. No. 595,066, Oct. 9, 1990, abandoned.

[51] Int. Cl.$^5$ ................................................ G01J 5/18
[52] U.S. Cl. ....................................... 374/122; 374/178; 324/95; 324/106
[58] Field of Search ............... 250/250; 324/95, 96, 324/106; 374/21, 32, 122, 178, 183, 185; 257/430, 429

[56] References Cited

U.S. PATENT DOCUMENTS

| | | | |
|---|---|---|---|
| 3,081,430 | 3/1963 | Hopfer | 324/106 X |
| 3,694,746 | 9/1972 | Hopfer | 324/106 X |
| 3,760,271 | 9/1973 | Bach, Jr. et al. | 324/95 |
| 4,044,371 | 8/1977 | Abdelrahman et al. | 357/28 |
| 4,047,436 | 9/1977 | Bernard et al. | 374/178 X |
| 4,456,919 | 6/1984 | Tomita et al. | 374/178 X |
| 4,733,170 | 3/1988 | McAllister et al. | 324/95 |
| 4,789,823 | 12/1988 | Delfs et al. | 324/95 |
| 4,854,731 | 8/1989 | Jenkins | 374/178 |
| 4,968,150 | 11/1990 | Mathews et al. | 374/32 |
| 5,100,829 | 3/1992 | Fay et al. | 374/178 X |

FOREIGN PATENT DOCUMENTS

| | | | |
|---|---|---|---|
| 808950 | 2/1981 | U.S.S.R. | 324/106 |
| 559130 | 12/1981 | U.S.S.R. | 324/106 |

OTHER PUBLICATIONS

DC to 40 GHz MMIC Power Sensor, Oct. 7, 1990, 1990 IEEE GaAs IC Symposium.

*Primary Examiner*—Tod R. Swann
*Attorney, Agent, or Firm*—David W. Gomes

[57] ABSTRACT

A monolithic integrated circuit power sensor provides a monolithic integrated circuit substrate, a conversion element formed either on or in the substrate for converting microwave energy into heat, and a thermally sensitive diode junction formed in sufficiently close proximity to the conversion element to be thermally coupled thereto.

4 Claims, 3 Drawing Sheets

MONOLITHIC MICROWAVE POWER SENSOR USING A HEAT SENSING DIODE JUNCTION

This is a continuation of copending application (s) Ser. No. 07/818,723 filed on Jan. 6, 1992 now abandoned which is a continuation of Ser. No. 07/595,066 filed on Oct. 9 now abandoned.

BACKGROUND OF THE INVENTION

1. Field of the Invention

This invention generally relates to microwave power sensors and, in particular, to such sensors which are constructed integrally with a monolithic circuit substrate.

2. Statement of the Prior Art

Various devices have been used for sensing microwave power. Such devices typically use one of a variety of sensors for converting microwave energy into heat and measuring the resulting temperature. Known devices include Wallaston wires, thermistors and thermocouples mounted in waveguides and coaxial transmission lines. Typically the sensing element is used as a microwave termination requiring that the microwave characteristics of the sensing element be matched to the circuitry or vice versa. For this reason, the sensing elements must be designed to have a low VSWR within the waveguide or coaxial mounting and must also have a temperature dependent electrical characteristic. Because of these requirements, power sensors which are operable over very broad frequency bands have not previously been developed.

Further, the minimum size of such sensors is often limited by the need to obtain sufficient temperature sensitivity. The various sensors have a measurable electrical sensitivity to temperature changes. Wires and thermistors vary in conductivity and thermocouples vary in output voltage. If the length of a wire or thermistor is small or the area of dissimilar metal junction of a thermocouple is small, the amount of change in the respective measurable electrical characteristic will also be small. This results in less sensitivity for determining temperature as the size of the sensing element is reduced, and an inherent limitation on the minimum size of such sensors.

Also, as the use of microwaves in communications and surveillance increases, so does the demand for performance at higher and higher microwave frequencies. This performance is inhibited in traditional circuit components by increases in their reactive impedances attributable to the higher operating frequencies. As reactive impedance is proportional to component size, there is a constant need for research and development of smaller circuitry, components, and devices to enable higher frequency performance.

SUMMARY OF THE INVENTION

Accordingly, it is the purpose of the present invention to provide a monolithic microwave power sensor operable over wide frequency ranges and having electrically separated microwave and heat sensing components for allowing optimal design and improved temperature sensitivity.

The device provides a monolithic integrated circuit substrate conversion means formed either on or in the substrate for converting microwave energy into heat, and a thermally sensitive diode junction formed in sufficiently close proximity to the conversion means to be thermally coupled thereto.

BRIEF DESCRIPTION OF THE DRAWINGS

The present invention is illustratively described in reference to the accompanying drawings of which.

DETAILED DESCRIPTION OF THE DRAWINGS

Figure 1:
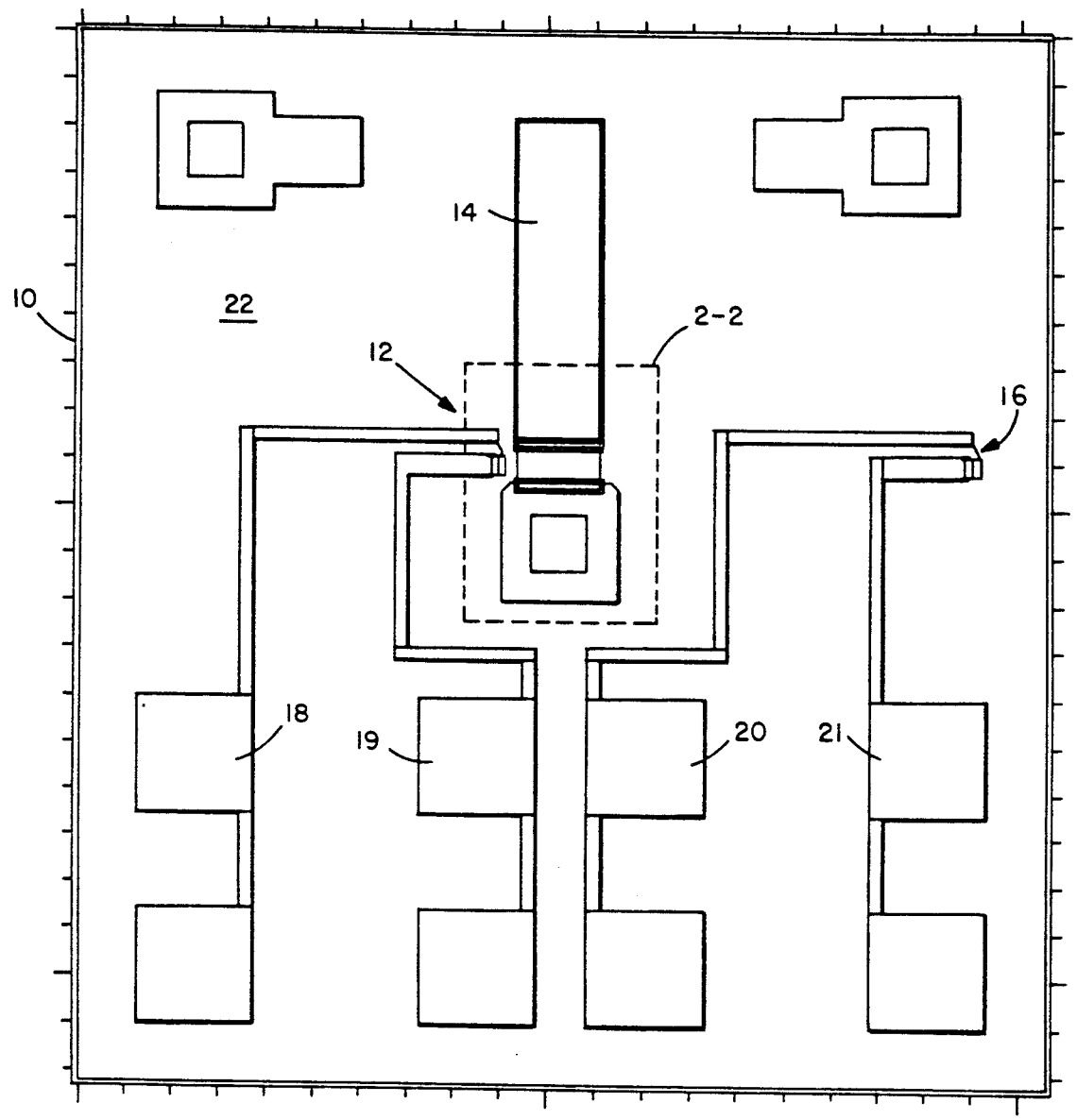
FIG. 1 is an enlarged top plan view of a portion of an integrated circuit including a microwave power sensor constructed in accordance with one embodiment of the present invention.

FIG. 1 shows a monolithic substrate 10 on which is formed a power sensor 12 constructed in accordance with the present invention. Generally included with the device 12 are a transmission line 14 for delivering microwave signals to the device 12, a temperature sensor 16, identical to one included in the device 12, to act as a reference therefor, and a plurality of connector pads 18-21 for making non-microwave electrical connection with the device 12 and temperature sensor 16.

Figure 2:
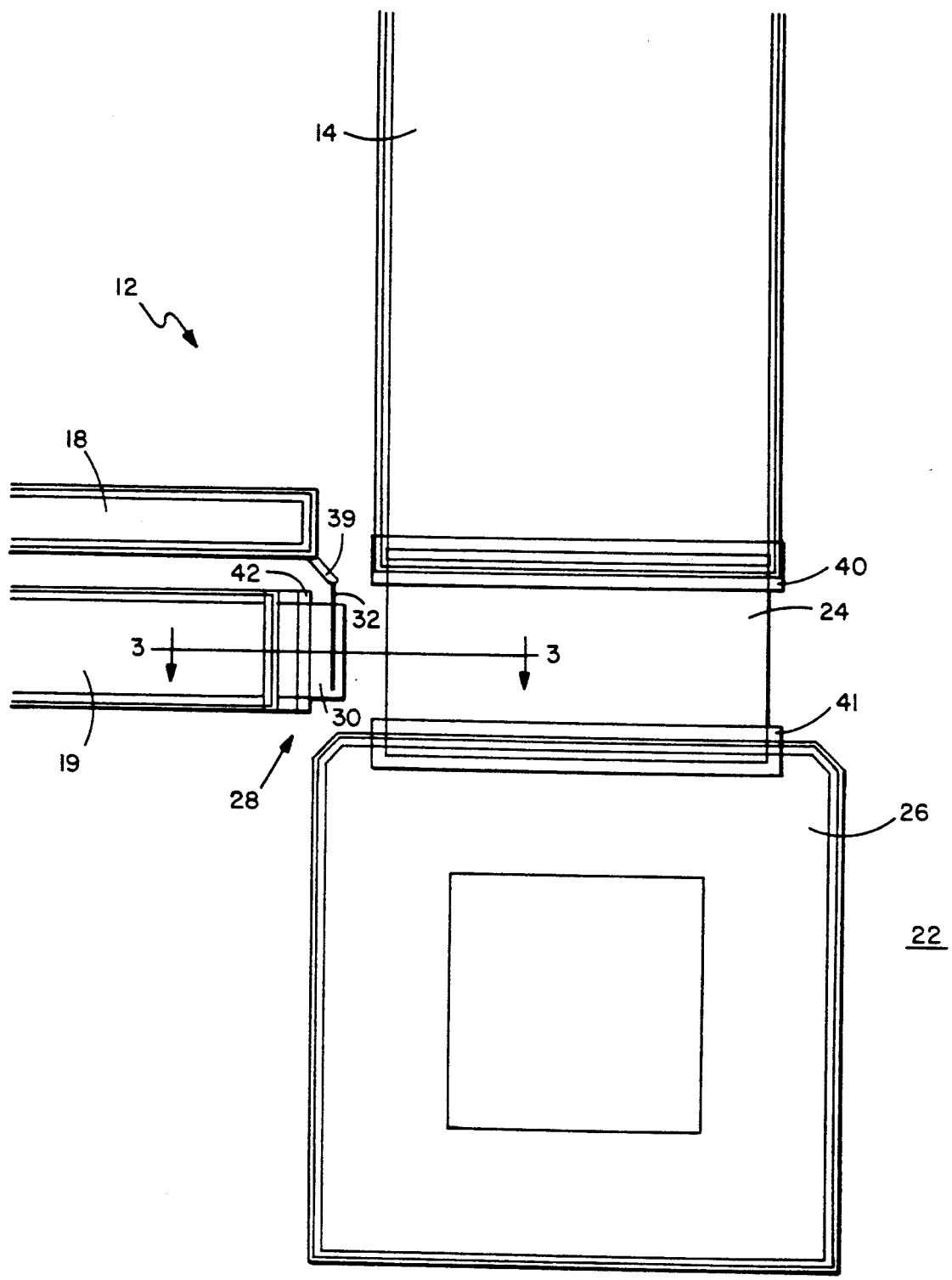
FIG. 2 is a further enlarged top plan view of the portion of FIG. 1 appearing in phantom box 2—2.

The remainder of the discussion will focus upon phantom box 2—2 which is conveniently enlarged in FIG. 2. The construction of temperature sensor 16 will be discussed with respect to an identical component located within the boundaries of phantom box 2—2. The configuration of contacts 18-21 is chosen for the present embodiment simply for the convenience of testing purposes. Any variety of circuitry may be used in conformance with known design parameters in adapting the present embodiment for various applications.

FIG. 2 shows details of the power sensing element 12 located at the end of transmission line 14. Members of the power sensing element 12 generally include a resistor 24, a ground connecting via 26 and a heat sensing diode junction 28. Resistor 24 is a bulk gallium arsenide construction located at the very end of transmission line 14. It is designed to have the same characteristic impedance and the same width as transmission line 14 for the purposes of acting as a termination thereof and reducing step discontinuities therewith. Via 26 is constructed at the other end of resistor 24 and passes through the substrate 10 to a ground plane on the other side thereof. This construction provides a well matched termination of transmission line 14 which minimizes the reflection of microwave energy back into the line 14. This insures that substantially all of the microwave energy delivered to transmission line 14 is converted to heat by resistor 24, thus providing greater accuracy to the power measurement.

Diode junction 28 is constructed on and within the substrate 10 in very close proximity to resistor 24 in order to be tightly, thermally coupled thereto. Diode junction 28 is essentially composed of an ion implanted semiconductor portion 30 formed right in the substrate 10 and a Schottky metal gate structure 32 formed on the surface of substrate 10 and extending over the portion 30.

Figure 3:
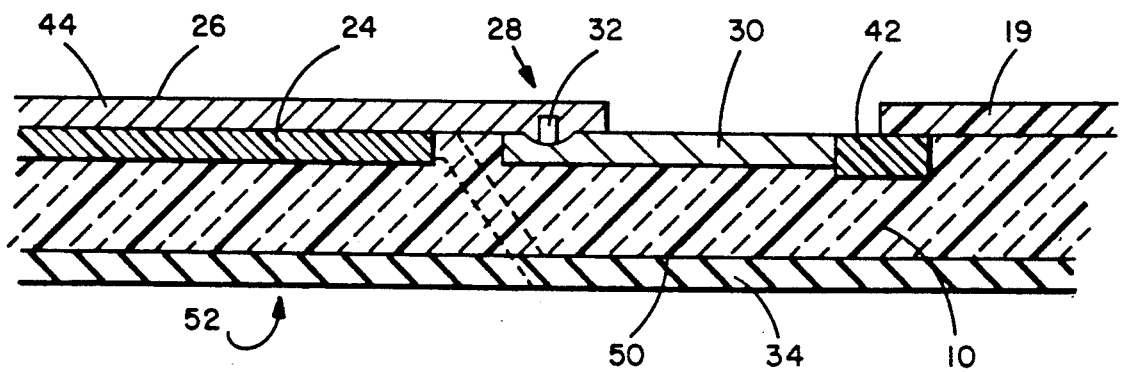
FIG. 3 is a sectional view of the components of FIG. 2 taken along view lines 3-3.

FIG. 3 shows a sectional view of a portion of the power sensor 12 of FIG. 2 taken along view lines 3—3.

Generally shown are the substrate 10, a ground plane 34, diode junction 28, and a portion of electrical contact 19. The details of FIG. 3 are described below in conjunction with the general construction method of the monolithic substrate 10. The basic principles of the monolithic construction process are well known as evidenced by the book *Monolithic Microwave Integrated Circuits,* edited by Robert A. Pucel, 1985, IEEE Press.

1. The top surface of the GaAs substrate 10 is first polished and cleaned.
2. The top of substrate 10 is then subjected to ion implantation of silicon atoms to reduce the intrinsic resistivity of the gallium arsenide to a value more suitable for the formation of bulk gallium arsenide resistors and active devices.
3. The substrate 10 is then thermally annealed to repair crystal lattice damage and to achieve the appropriate activation of the implanted material. The heating is controlled to yield the desired sheet resistance which will provide a (50) ohm resistance from the design specifications of resistor 24. This resistance is also used for active semiconductor device region 30.
4. A layer of photoresist is applied to the surface and then patterned and developed to cover the areas which will become resistor 24 and active semiconductor device 30 and to expose the remainder of the surface. The exposed area is subjected to ion implantation of boron which raises the resistivity of the exposed substrate back to almost its intrinsic level and thereby isolates resistor 24 and active semiconductor device 30. The photoresist is then cleaned off.
5. Another layer of photoresist is applied and then patterned and developed to expose the areas which will become ohmic contacts 40,41,42 for resistor 24 and active semiconductor device 30.
6. Ohmic contacts 40,41,42 are formed on the exposed substrate using gold, germanium and nickel and a suitable metal deposition technique such as electron beam evaporation.
7. The photoresist is removed, and the ohmic contacts are suitably sintered to form low resistance electrical connections to the bulk gallium arsenide termination resistor 24 and active semiconductor device 30.
8. The substrate is cleaned, and another layer of photoresist is applied and suitably patterned and developed in the shape of the diode junction gate 32.
9. The gate pattern is then etched to form a slight recess 46 in the surface of substrate 10 and into which recess diode junction gate 32 will be formed.
10. Gate 32 may then be formed by any suitable process such as inverting the substrate 10 and condensing evaporated titanium, platinum and gold onto the downwardly facing surface.
11. The photoresist and the metal on top of it are then lifted off by the application of a suitable solvent leaving the diode junction gate 32 adhered to the substrate 10.
12. Another layer of photoresist is applied to the surface and then patterned and developed to expose the areas which are to become the input transmission line 14, metal bonding pads 18-21, and the topside catch pad 44 for the via 26.
13. First metal layers of titanium, tungsten, and gold are deposited on the entire substrate including the photoresist and areas not covered by the photoresist.
14. The first metal layers are then removed using a metal liftoff technique in which a solvent is employed to float off the metal on top of the photoresist and leave metal adhered to the substrate forming the basis for transmission line 14, metal bonding pads 18-21, gate connector 39 and the topside catch pad 44.
15. The surface is cleaned, and a layer of silicon nitride dielectric 48 is applied to serve as a passivation layer for the gate 32.
16. A layer of photoresist is applied and patterned and developed to expose areas of the dielectric 48 where no passivation layer is desired. These areas include metal bonding pads 18-21, transmission line 14, and catch pad 44.
17. The dielectric layer 48 is then removed from undesired areas using reactive ion etching techniques.
18. A layer of photoresist is then applied and suitably patterned and developed to expose all areas where thick plated metal is desired, in particular transmission line 14, metal bonding pads 18-21 and catch pad 44.
19. A plating interconnect layer of metal is applied and the wafer is electroplated with gold to form thick layers required for transmission line 14, metal bonding pads 18-21 and catch pad 44.
20. The substrate 10 is next thinned by precision grinding of the backside 50 while the topside of the wafer is protected from damage.
21. The backside 50 is then patterned and developed to expose an area for via 26, which area is then etched to create a hole 52 extending through to the topside catch pad 44.
22. The processing of the wafer is completed by applying titanium and gold to form the ground plane layer 34 on the backside of the substrate 10. This layer 34 connects to the topside catch pad 44 to complete the ground connection of via 26.

In operation, microwave signals entering the power sensor 12 through transmission line 14 are converted to heat energy which causes the temperature of resistor 24 to rise. The tight thermal coupling between diode junction 28 and resistor 24 enables the heat from resistor 24 to change the conductivity of diode junction 28.

Figure 4:
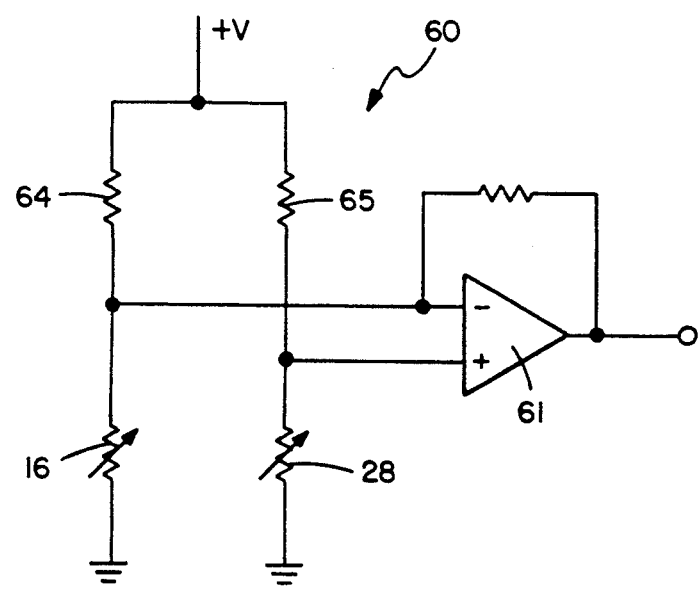
FIG. 4 is a schematic of a circuit for producing a signal representing microwave power in response to the sensor of FIGS. 1-3.

FIG. 4 shows a circuit 60 for converting the temperature dependent resistance variations of the diode junction 28 into an indication of the amount of microwave energy absorbed by the resistor 24. The circuit 60 is a bridge network having an operational amplifier 61 to detect the difference between the two branches of the bridge. Junction 28 is represented as a variable resistance which is matched to the other temperature sensitive diode junction 16. Junction 16 is constructed on the monolithic substrate 10 to be identical to junction 28. It is constructed during the same processing steps and designed to have the same configuration. Like the junction 28, it is thermally coupled to the substrate 10 in the same manner as junction 28, except for the proximity of resistor 24. Junction 16 is not thermally coupled to resistor 24 but is located in the same general area so that it can act as a reference representing the ambient temperature of substrate 10.

The bridge circuit also includes a pair of matched resistors 64,65. By this arrangement the difference between the voltages from junctions 28 and 16 represent the difference in heating caused by the absorption of microwave energy by resistor 24. This voltage difference may be appropriately scaled in amplifier 61 to provide a measurement of microwave power.

CONCLUSION

Accordingly, the present invention provides a monolithic microwave power sensor having a very broad frequency range and a very high degree of isolation between microwave and measurement elements.

The embodiments described above are intended to be taken in an illustrative and not a limiting sense. Various modifications and changes may be made to the above embodiments by persons skilled in the art without departing from the scope of the present invention as defined in the appended claims.

What is claimed is:

1. A monolithic integrated circuit device for sensing microwave power, comprising:
    a monolithic integrated circuit substrate;
    an integrated circuit microwave transmission line formed on the substrate;
    conversion means formed in the substrate in the form of an ion implanted resistor coupled to the transmission line for converting microwave energy into heat; and
    a thermally sensitive diode junction electrically insulated from the conversion means and formed in the substrate and in sufficiently close proximity to the conversion means to be thermally coupled thereto, wherein the diode junction is formed by ion implantation of a portion of the substrate and by the creation of a Schottky metal contact in electrical contact with the ion implanted portion; and
    means responsive to the conductivity of the diode junction for generating a signal indicative of the microwave energy received by the conversion means.

2. The device of claim 1, wherein the means for generating includes a second thermally sensitive diode junction, substantially identical to the first said diode junction, formed in the substrate at a sufficient distance from the conversion means for avoiding thermal coupling thereto, and means responsive to the conductivity of the second diode junction for compensating the conductivity of the first said diode junction for the ambient temperature of the substrate.

3. A monolithic integrated circuit device for sensing microwave power, comprising:
    a monolithic integrated circuit substrate including resistive conversion means formed as a first ion implanted portion of the substrate for converting microwave energy into heat and a second ion implanted portion of the substrate electrically insulated from the conversion means and formed in sufficiently close proximity to the conversion means to be thermally coupled thereto; and
    a thermally sensitive diode junction formed by the creation of Schottky metal contact in electrical contact with the second ion implanted portion and coupled to the conversion means; and
    means responsive to the conductivity of the diode junction for generating a signal indicative of the microwave energy received by the conversion means.

4. The device of claim 3, wherein the means for generating includes a second thermally sensitive diode junction, substantially identical to the first said diode junction, formed in the substrate at a sufficient distance from the conversion means for avoiding thermal coupling thereto, and means responsive to the conductivity of the second diode junction for compensating the conductivity of the first said diode junction for the ambient temperature of the substrate.

* * * * *